United States Patent
Kim et al.

(10) Patent No.: US 7,535,313 B2
(45) Date of Patent: *May 19, 2009

(54) BALUN

(75) Inventors: Chul-soo Kim, Yongin-si (KR); Dal Ahn, Yongin-si (KR); Kwi-soo Kim, Yongin-si (KR); In-sang Song, Yongin-si (KR); Yun-kwon Park, Yongin-si (KR); Kuang-woo Nam, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 126 days.

This patent is subject to a terminal disclaimer.

(21) Appl. No.: 11/656,981

(22) Filed: Jan. 24, 2007

(65) Prior Publication Data

US 2007/0290766 A1    Dec. 20, 2007

(30) Foreign Application Priority Data

Jun. 19, 2006   (KR) .................. 10-2006-0054878

(51) Int. Cl.
*H03H 5/00*    (2006.01)

(52) U.S. Cl. .................... 333/26; 333/25; 333/204; 333/185

(58) Field of Classification Search ............. 333/25–26, 333/185, 202, 204, 238, 246
See application file for complete search history.

(56) References Cited

U.S. PATENT DOCUMENTS 6,211,751 B1 *   4/2001   Aoki ........................ 333/26
7,397,328 B2 *   7/2008   Yasuda et al. ............ 333/204

* cited by examiner

*Primary Examiner*—Anh Q Tran
(74) *Attorney, Agent, or Firm*—Sughrue Mion, PLLC

(57) ABSTRACT

A balun includes an input line for receiving an unbalanced signal, an output line for receiving the unbalanced signal from the input line and outputting a balanced signal, and a ground. The input line and the output line are formed in the same layer, and the ground is formed in a different layer from the input line and the output line. The ground has an opening so as to generate a potential difference between the first output line and the second output line. The ground is electrically connected to the input line.

24 Claims, 10 Drawing Sheets

BALUN

CROSS-REFERENCE TO RELATED APPLICATIONS

This application claims priority from Korean Patent Application No. 10-2006-0054878 filed Jun. 19, 2006, in the Korean Intellectual Property Office. The priority application is incorporated herein by reference in its entirety.

BACKGROUND OF THE INVENTION

1. Field of the Invention

Apparatuses consistent with the present invention relate to a balun. More particularly, the present invention relates to a balun which reduces its size and improves its usable bandwidth.

2. Description of the Related Art

Balance to unbalance ("balun") is a circuit which converts an unbalanced signal to a balanced signal or vice versa.

FIG. 1 is a perspective view of a conventional balun, and FIG. 2 is a cross sectional view of the conventional balun, taken along the line I-I' of FIG. 1.

Referring to FIGS. 1 and 2, the conventional balun 90 includes a base plate 10, a ground 20, first and second output lines 30 and 40, first and second conductive portions 50 and 60, an input line 70, and a dielectric layer 80.

The ground 20 is provided under the base plate 10. The first and second output lines 30 and 40 and the input line 70 are placed on the base plate 10. The ground 20 covers all over the lower part of the base plate 10.

The first and second output lines 30 and 40 are spaced away from each other at an interval, facing each other based on the center line traversing the base plate 10. The first and second output lines 30 and 40 are patterned in a clamp shape.

At one end of the first output line 30, a first output port OP1 is provided. The first output port OP1 outputs a first output signal corresponding to an incoming signal from the input line 70. At one end of the second output line 40, a second output port OP2 is provided. The second output port OP2 outputs a second output signal corresponding to the incoming signal from the input line 70. The first and second output ports OP1 and OP2 are positioned in the proximity to each other.

The first and second conductive portions 50 and 60 electrically connect the first and second output lines 30 and 40 to the ground 20.

The first conductive portion 50 is interposed between the ground 20 and the first output line 30. The base plate 10 has a first via hole formed by removing part of it. The first conductive portion 50 is placed in the first via hole to electrically connect the ground 20 with the first output line 30, thereby electrically connecting the first output line 30 to the ground 20.

The second conductive portion 60 is interposed between the ground 20 and the second output line 40. The base plate 10 has a second via hole formed by removing part of it. The second conductive portion 60 is placed in the second via hole to electrically connect the ground 20 with the second output line 40, thereby electrically connecting the second output line 40 to the ground 20.

The input line 70 is positioned above the first and second output lines 30 and 40. The input line 70 has an input port IP at an end adjacent to the first output line 30 to receive the incoming signal from the outside.

The dielectric layer 80 is deposited on an upper surface of the base plate 10 where the first and second output lines 30 and 40 are formed. The dielectric layer 80 is interposed between the first and second output lines 30 and 40 and the input line 70.

When an unbalanced signal is input to the input port IP, the unbalanced signal is applied to the first and second output lines 30 and 40. The first and second output ports OP1 and OP2 convert the unbalanced signal to a balanced signal and output first and second output signals. Note that the first and second output lines 30 and 40 produce signals that are half of the input signal respectively.

Accordingly, the input signal is divided and output by half, and the phase difference between the first and second output signals is about 180 degrees. For so doing, the length of the input line 70 above the first output line 30 should meet about $\lambda/4$ of the input wavelength and the length of the input line 70 above the second output line 40 should meet about $\lambda/4$ of the input wavelength. Likewise, the length of the first and second output lines 30 and 40 facing the input line 70 should meet about $\lambda/4$ of the input wavelength.

To receive the unbalanced signal and output the balanced signals from the first and second output ports OP1 and OP2 of the balun 90, the input line 70 and the first and second output lines 30 and 40 are required to make their facing parts meet about $\lambda/4$.

In addition, to extend the matching frequency band, the balun 90 is required to extend the lengths of the input line 70 and the first and second output lines 30 and 40, respectively. As a result, the overall size of the balun 90 is increased.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a balun which has reduced size due to shortening of the length of the transmission lines, and is capable of wideband matching.

In one aspect, the present invention relates to a balun that includes a plate, a first signal line, a second signal line, a ground, and a first dielectric.

The first signal line is formed on the plate and configured to transfer an incoming signal. The second signal line is disposed on the plate in a same layer as the first signal line and configured to receive the incoming signal from the first signal line and output first and second output signals that are different from each other. The ground is disposed on the plate in a different layer from the first and second signal line and wherein the ground comprises an opening and is configured to generate potential difference between a path in which the first output signal of the second signal line is transferred and a path in which the second output signal of the second signal line is transferred. The ground is electrically connected to the first signal line. The first dielectric is interposed between the first and second signal lines and the ground.

The first signal line may include a first port configured to receive the incoming signal from outside, and a second port facing the first port and configured to output the incoming signal received through the first port to the second signal line.

The balun may further include a first conductive portion which electrically connects the first port to the ground. The dielectric may have a first via hole formed by removing part of the dielectric in an overlapping area of the second port and the ground. The first conductive portion may be electrically connected to the first port and the ground through the first via hole.

The ground may include a first metal disposed in a closed-loop shape around a perimeter of the plate, a second metal which extends from the first metal and facing the first and second signal lines, and a third metal which extends from the first metal, wherein the third metal lies apart from the second metal at an interval in an area corresponding to the first port and the input port, and faces the first signal line.

The second metal may be electrically connected to the second port through the first conductive portion.

The second metal and the third metal comprise a plurality of branches extending from the first metal.

The ground may include a first ground electrically connected to the second port through the first conductive portion, a second ground disposed above and apart from the first ground, and a conductor which electrically connects the first ground with the second ground and supporting the second ground.

A width of an area where the first port is formed in the first signal line may be wider than a width of other areas.

The second signal line may include an input port disposed adjacent to the second port and configured to receive the incoming signal, a first output line extending from the input port, wherein the first output line lies adjacent to the first signal line, and is configured to output the first output signal, and a second output line which extends from the input port to a different direction from the first output line and configured to output the second output signal.

The input port is disposed at a center of the second signal line. A length of the first signal line is about equal to a length covering the input port and the first output line.

A phase difference between the first output signal and the second output signal may be about 180 degrees.

The balun may further include at least one capacitor disposed over the ground and electrically connected to the ground.

The capacitor may include a first electrode which is disposed over the ground and electrically connected to the ground on the side of the second signal line where the second output signal is output, a second electrode which is disposed over the first electrode and electrically connected to the ground on the side of the first signal line where the first output signal is output.

The balun may further include a second dielectric between the ground and the first electrode, and a third dielectric between the first electrode and the second electrode.

The second dielectric may have a second via hole formed by removing part of the second dielectric to expose part of the ground on the side of the second signal line where the second output signal is output, and the third dielectric may have a third via hole formed by removing part of the third dielectric to expose part of the ground on the side of the first signal line where the first output signal is output. Accordingly, the first electrode is electrically connected to the ground through the second via hole, and the second electrode is electrically connected to the ground through the third via hole.

The balun may further include a second conductive portion which is disposed in the second via hole and configured to electrically connect the first electrode to the ground, and a third conductive portion which is disposed in the third via hole and configured to electrically connect the second electrode to the ground.

An area of the first electrode corresponding to the third conductive portion, may be removed and the first electrode may be insulated from the third conductive portion.

The capacitor may include a third electrode which is disposed over substantially all of the first and second areas above the ground, and a fourth electrode which extends from the third electrode perpendicular to the third electrode, wherein the fourth electrode lies on the side of the first signal line where the first output signal is output, and contacts with the ground to electrically connect the ground to the third electrode. The fourth electrode may be integrally formed with the third electrode.

The balun may further include a fourth dielectric disposed between the third electrode and the ground.

In another aspect, the present invention relates to a balun that includes a plate, a first signal line, a second signal line, a ground and a dielectric.

The first signal line comprises a first port formed at a first end and configured to receive an incoming signal and a second port formed at a second end facing the first end and configured to output the incoming signal received from the first port. The first signal line is formed on the plate and configured to transfer the incoming signal.

The second signal line disposed on the plate adjacent to the first signal line, wherein the second signal line traverses a center of the plate, has an input port formed adjacent to the second port and configured to receive the incoming signal from the second port, and is configured to output at ends first and second output signals having different phases from each other corresponding to the incoming signal respectively.

The ground disposed around a perimeter of the plate and comprising a first metal in a closed-loop shape, a second metal extending from the first metal to the center of the plate and facing the first and second signal lines, and a third metal. The third metal extends from the first metal to the center of the plate, facing the second signal line, and disposed apart from the second metal at an interval in an area where the input port and the second port are disposed. The ground is electrically connected to the second port.

The dielectric disposed between the first and second signal lines and the ground.

In another aspect, the present invention relates to a balun that includes a plate, a first signal line, a second signal line, a ground, a dielectric, and a capacitor.

The first signal line has a first port formed at a first end and configured to receive an incoming signal and a second port formed at a second end facing the first end and configured to output the incoming signal received from the first port. The first signal line is formed on the plate to transfer the incoming signal.

The second signal line disposed on the plate adjacent to the first signal line, wherein the second signal line traverses a center of the plate, has an input port formed adjacent to the second port and configured to receive the incoming signal from the second port, and is configured to output at ends first and second output signals having different phases from each other corresponding to the incoming signal respectively.

The ground disposed around a perimeter of the plate and comprising a first metal in a closed-loop shape, a second metal extending from the first metal to the center of the plate and facing the first and second signal lines, and a third metal. The third metal extends from the first metal to the center of the plate, facing the second signal line, and disposed apart from the second metal at an interval in an area where the input port and the second port are disposed. The ground is electrically connected to the second port.

The dielectric disposed between the first and second signal lines and the ground.

The capacitor is disposed over the ground and has a first electrode electrically connected to the third metal and a second electrode spaced over and apart from the first electrode and electrically connected to the second metal.

In another aspect, the present invention relates to a balun that includes a plate, a first signal line, second signal line, a ground, a dielectric, and a capacitor.

The first signal line comprising a first port formed at a first end and configured to receive an incoming signal and a second port formed at a second end facing the first end configured to output the incoming signal received from the first port. The first signal line is formed on the plate and configured to transfer the incoming signal.

The second signal line disposed on the plate adjacent to the first signal line, wherein the second signal line traverses center of the plate, has an input port formed adjacent to the second port and configured to receive the incoming signal from the second port, and is configured to output at ends first and second output signals having different phases from each other corresponding to the incoming signal respectively.

The ground disposed around a perimeter of the plate and comprising a first metal in a closed-loop shape, a second metal extending from the first metal to the center of the plate and facing the first and second signal lines, and a third metal. The third metal extends from the first metal to the center of the plate, faces the second signal line, and disposed apart from the second metal at an interval in an area where the input port and the second port are placed. The ground is electrically connected to the second port.

The dielectric disposed between the first and second signal lines and the ground.

The capacitor is disposed over the ground and comprising a third electrode spaced apart from the third metal at an interval and a fourth electrode which extends from the third electrode and contacts with the second metal to electrically connect the second metal to the third electrode.

BRIEF DESCRIPTION OF THE DRAWINGS

The above aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Figure 1:
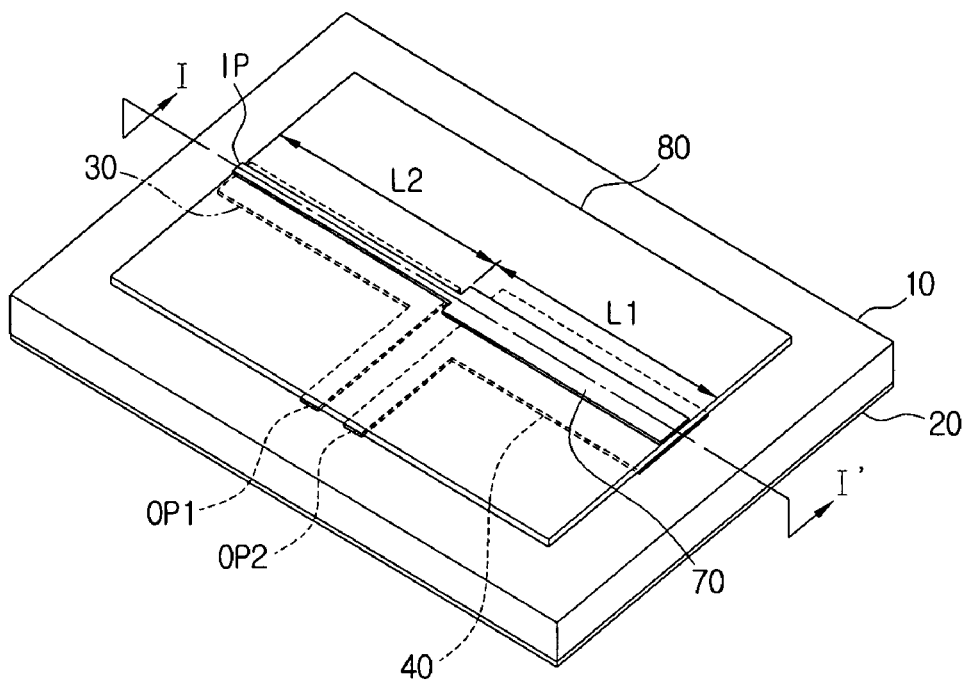
FIG. 1 is a perspective view of a conventional balun.
Figure 2:
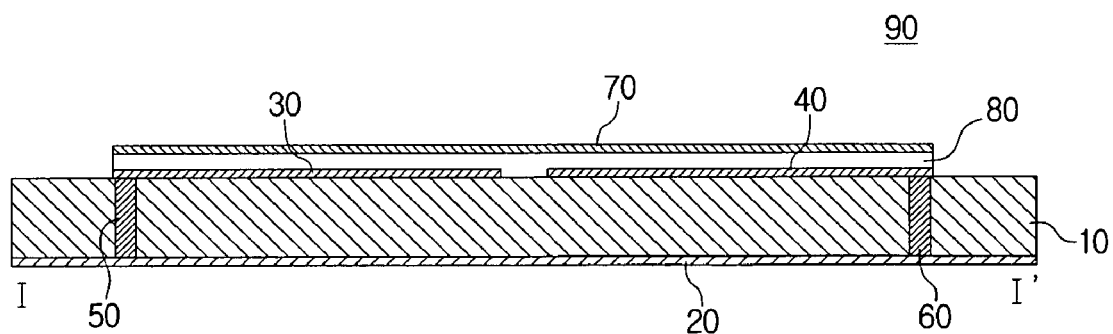
FIG. 2 is a cross sectional view of the conventional balun, taken along the line I-I' of FIG. 1.

Certain exemplary embodiments of the present invention will be described in greater detail with reference to the accompanying drawings.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail, since they would obscure the invention in unnecessary detail.

Figure 3:
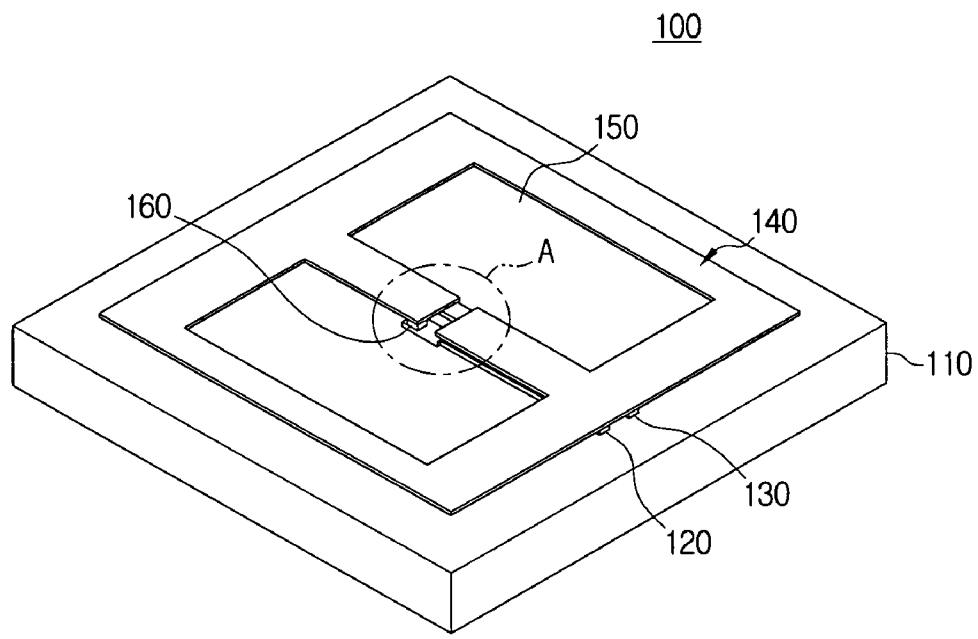
FIG. 3 is a perspective view of a balun in accordance with a first embodiment of the present invention.
Figure 4:
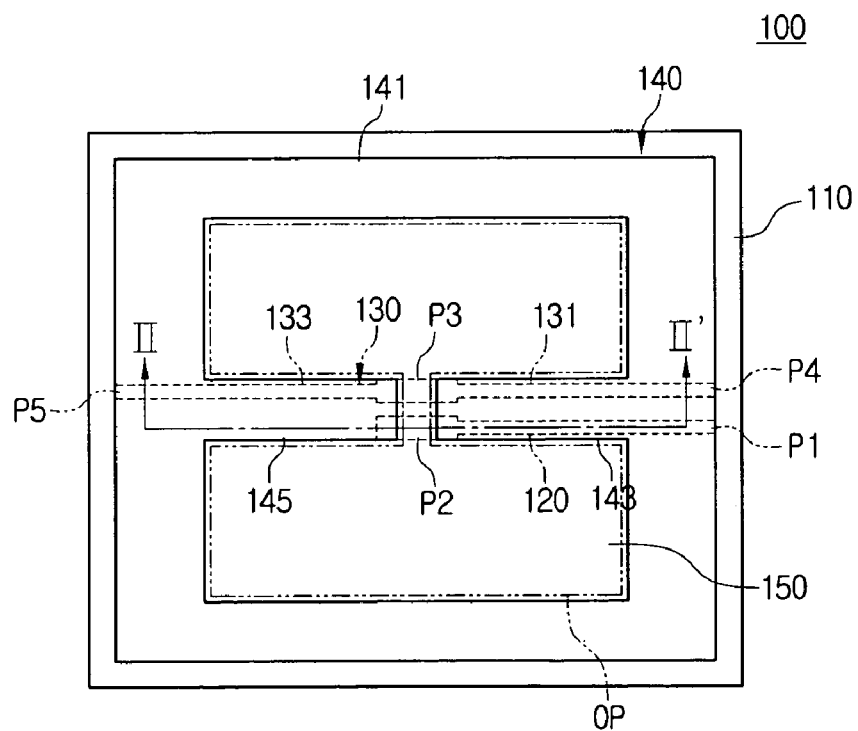
FIG. 4 is a plane view of the balun of FIG. 3.

In FIGS. 3 and 4, a balun in accordance with a first embodiment of the present invention is shown. The balun 100 includes a base plate 110, an input line 120, an output line 130, a ground 140, and a first dielectric layer 150.

The base plate 110 is formed using an insulating material such as silicon.

The input line 120 is placed on the base plate 110. The input line 120 traverses the center of the base plate 110. The input line 120 receives an incoming signal from outside and provides the received signal to the output line 130. A first end of the input line 120 has a first port P1, and a second end facing the first end has a second port P2.

The first port P1 receives the incoming signal from the outside, and the second port P2 forwards the incoming signal to the output line 130. Note that the width of the second port P2 is wider than other areas of the input line 120.

The output line 130 on the base plate 110 is spaced apart from the input line 120 at an interval. The output line 130 includes an input port P3 adjacent to the second port P2 of the input line 120 and first and second output lines 131 and 133 at ends of the input port P3, respectively.

The input port P3 is positioned in the center of the output line 130. The width of the input port P3 is wider than that of the first and second output lines 131 and 133. The input port P3 receives the incoming signal from the second port P2 and forwards it to the first and second output lines 131 and 133.

The first output line 131 lies adjacent to the input line 120 and extends from the input port P3 along the longitudinal direction of the input line 120. The first output line 131 is spaced apart from the input line 120 at an interval in parallel with the input line 120. A first output port P4 is positioned at an end of the first output line 131. The first output port P4 lies adjacent to the first port P1 and outputs a first output signal corresponding to the incoming signal.

The second output line 133 extends from the input port P3 and faces the first output line 131 centering on the input port P3. A second output port P5 is positioned at an end of the second output line 133. The second output port P5 outputs a second output signal corresponding to the incoming signal.

The output of the first and second output signals is now explained. First, the input signal from the first port P1 is transferred along the input line 120 and output through the second port P2. The input signal from the second port P2 is fed to the input port P3 through the interval between the second port P2 and the input port P3 of the output line 130. Herein, the phase difference between the first and second output signals is about 180 degrees. Accordingly, the first and second output lines 131 and 133 produce the first and second output signals by halving the input signal received from the input port P3.

Figure 5:
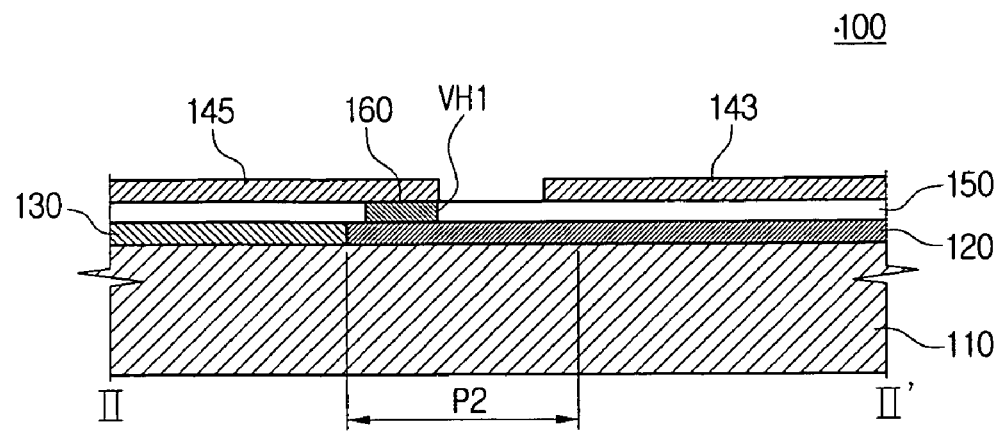
FIG. 5 is a cross sectional view of the balun, taken along the line II-II' of FIG. 4.

With reference to FIGS. 4 and 5, the ground 140 lies over the input line 120 and the output line 130. The ground 140 has a first pattern portion electrically connected with the input line 120 and an opening formed by removing part of the ground.

The first pattern portion of the ground 140 includes a first metal 141 around the perimeter of the base plate 110, a second metal 143 extending from the first metal 141, and a third metal 145 extending from the first metal 141.

The first metal 141 is formed in a closed-loop shape.

The second metal 143 extends from the first metal 141 toward the center of the base plate 110. The second metal 143 lies above the input line 120 and the first output line 131.

The third metal 145 extends from the first metal 141 toward the center of the base plate 110 and lies above the second output line 133.

Figure 6:
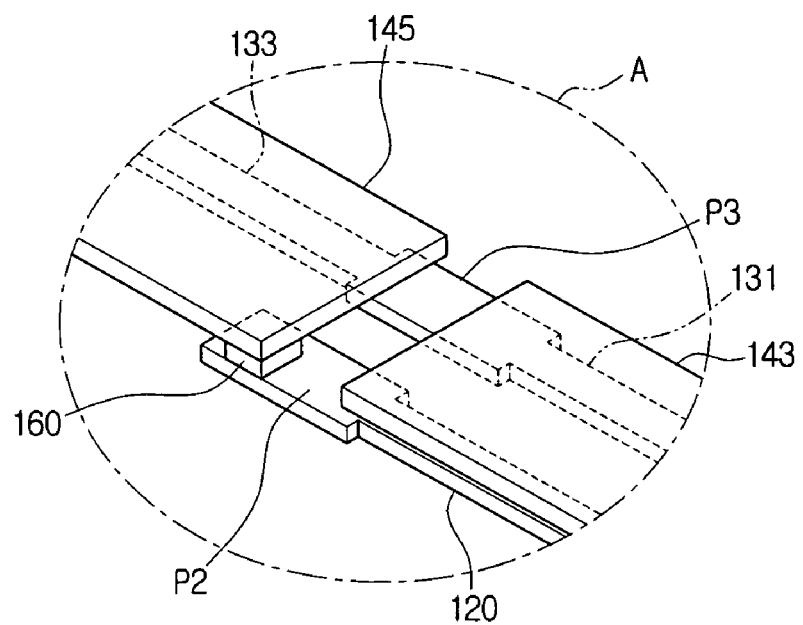
FIG. 6 is an enlarged perspective view of area A of FIG. 3.

With reference to FIGS. 4 and 6, the third metal 145 faces the second metal 143 and lies away from the second metal 143 at an interval. Thus, the electrical potential difference occurs between the second metal 143 and the third metal 145. As a result, the phase difference occurs between the first output port P4 and the second output port P5 and thus the incoming signal is halved and fed to the first and second output lines 131 and 133.

The second port P2 and the input port P3 are partially exposed through the interval between the second and third metal 143 and 145. The end of the third metal 145 is electrically connected with the second port P2, thereby electrically connecting the ground 140 with the input line 120. Even when the ground 140 is electrically connected with the input line 120, all the incoming signal is not induced to the ground 140 because the second metal 143 and the third metal 145 are apart from each other. It is noted that the distance between the second metal 143 and the third metal 145 determines capacitance of the balun 100.

The opening OP is defined by the first, second, and third metals 141, 143 and 145. The size of the opening OP determines inductance of the balun 100.

The opening OP is in an 'I' shape in the first embodiment of the present invention. In another embodiment, the opening OP may be formed in various shapes, such as, for example, a dumbbell or spiral according to the shapes of the first, second, and third metals 141, 143, and 145.

Referring back to FIGS. 4 and 5, the first dielectric layer 150 is formed over the base plate 110 where the input line 120 and the output line 130 are positioned. The first dielectric layer 150 is interposed among the input line 120, the output line 130, and the ground 140. The first dielectric layer 150 is formed with an insulating material, such as aluminum nitride (AlN) or silicon oxide ($SiO_2$).

The balun 100 further includes a first conductive portion 160, which electrically connects the input line 120 to the ground 140.

As shown in FIG. 6, the first conductive portion 160 is interposed between the second port P2 and the third metal 145 to electrically connect the second port P2 and the third metal 145. Herein, the first dielectric layer 150 has a first via hole VH1 formed by removing part of the first dielectric layer 150 to expose part of the second port P2. The first conductive portion 160 is positioned in the first via hole VH1.

As such, the second port P2 and the third metal 145 are short-circuited by the first conductive portion 160. Thus, the incoming signal to the input line 120 is fed to the output line 130 through the second port P2, rather than output back to the first port P1.

As illustrated above, the balun 100 has the input line 120 and the output line 130 in the same layer. The ground 140 above the input line 120 and the output line 130 is patterned in a certain shape to produce the potential difference between the first output line 131 and the second output line 133. As a result, the output line 130 has the phase difference of about 180 degrees between the first output signal from the first output port P4 and the second output signal from the second output port P5. Even when the lengths of the first and second output lines 131 and 133 respectively are smaller than $\lambda/4$ of the input wavelength, the incoming signal is halved and output as the first and second output signals. Therefore, the entire size of the balun 100 can be reduced.

Figure 7:
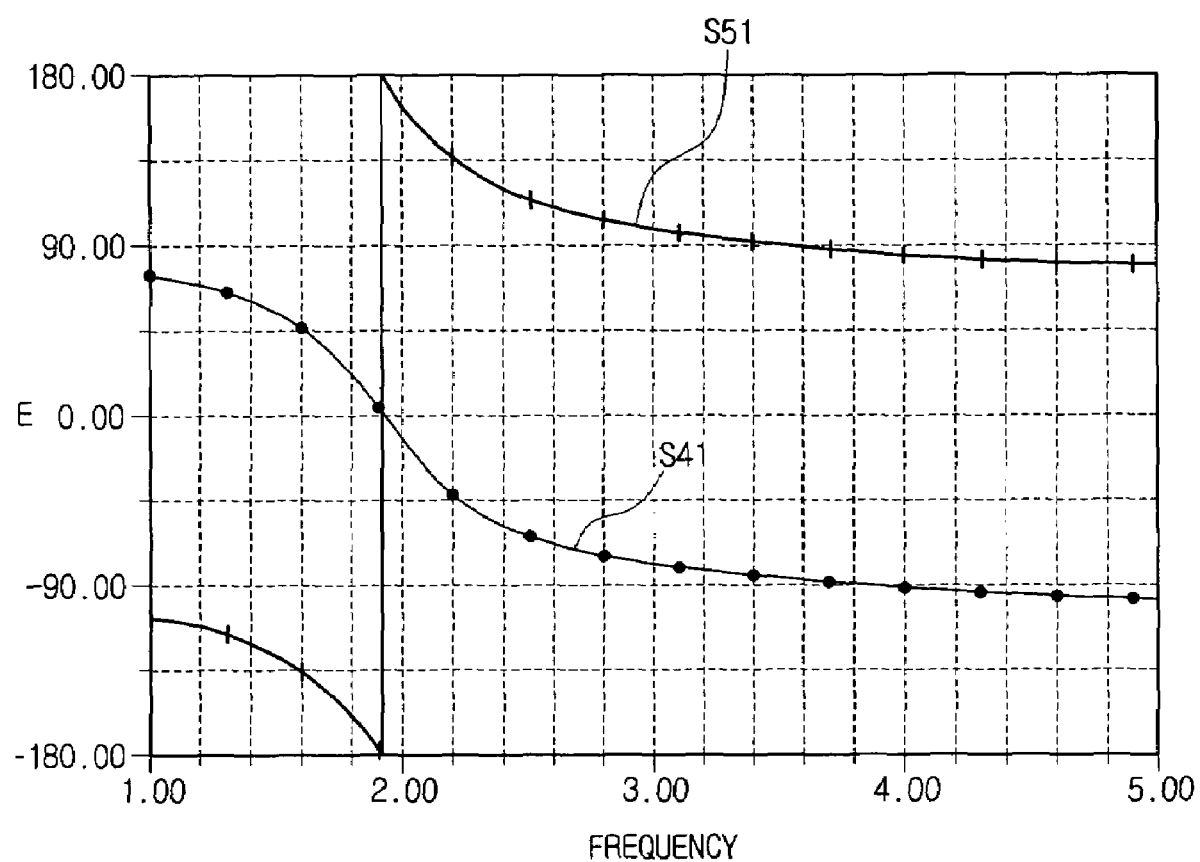
FIG. 7 is a graph showing a phase of output signals from first and second output ports of FIG. 4.
Figure 8:
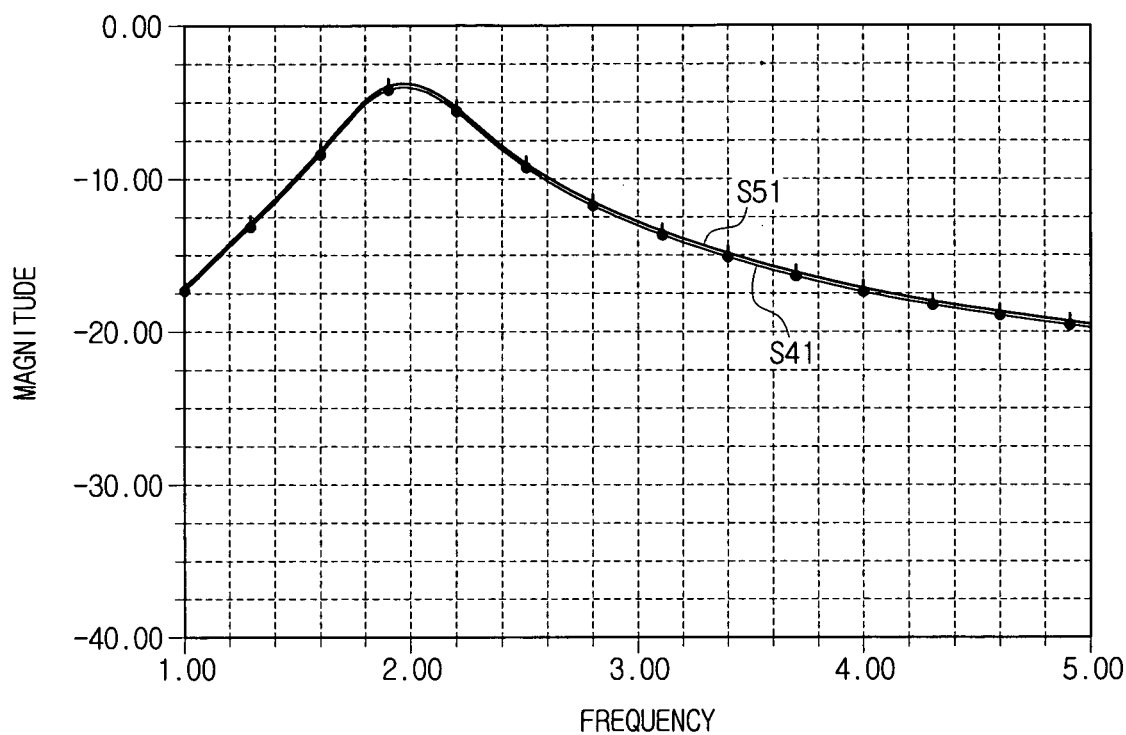
FIG. 8 is a graph showing a magnitude of the output signals from the first and second output ports of FIG. 4.

FIG. 7 is a graph showing a phase of the output signals from the first and second output ports of the balun shown in FIG. 4, and FIG. 8 is a graph showing a magnitude of the output signals from the first and second output ports of the balun shown in FIG. 4.

The first output signal S41 is fed to the first port P1 and output from the first output port P4, and the second output signal S51 is fed to the first port P1 and output from the second output port P5.

When the frequency is about 2 GHz, the phase of the first output signal S41 is about 0 degree, the phase of the second output signal S51 is about 180 degrees, and the magnitude of the first and second output signals S41 and S51 is about 3 dB. In other words, the phase difference of the first and second output signals S41 and S51 is about 180 degrees, a half of the incoming signal is output as the first output signal S41, and the other half is output as the second output signal S51.

As such, the balun 100 converts the unbalanced incoming signal to the first and second balanced output signals S41 and S51.

Figure 9:
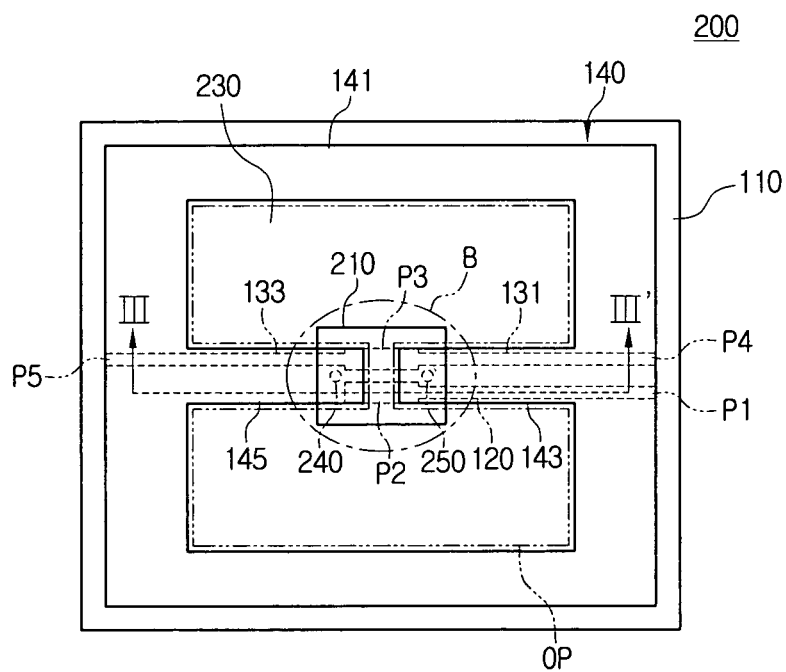
FIG. 9 is a plane view of a balun in accordance with a second embodiment of the present invention.
Figure 10:
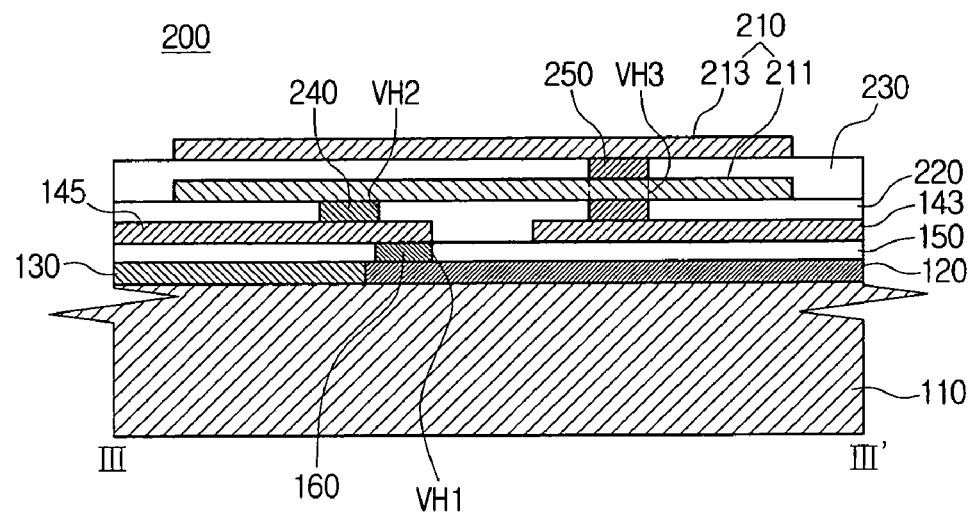
FIG. 10 is a cross sectional view of the balun, taken along the line III-III' of FIG. 9.

In FIG. 9, a plane view of a balun in accordance with a second embodiment of the present invention is shown. FIG. 10 is a cross sectional view of the balun, taken along the line III-III' of FIG. 9.

The balun 200 has much of the same structure as the balun 100 of FIG. 3, except that balun 200 further includes a capacitor 210, a second dielectric layer 220, a third dielectric layer 230, a second conductive portion 240, and a third conductive portion 250. The components in balun 200 having the same function as in the balun 100 of FIG. 3 use the same reference numerals throughout the explanation of the balun 200. Further illustration as to the like components will be omitted for brevity.

The balun 200 includes a base plate 110; an input line 120; an output line 130; a ground 140; first, second, and third dielectric layers 150, 220, and 230; a capacitor 210; and first, second, and third conductive portions 160, 240, and 250.

The input line 120 and the output line 130 lie on the base plate 110. The input line 120 receives an incoming signal from outside and forwards it to the output line 130. The output line 130 outputs first and second output signals corresponding to the incoming signal.

The first dielectric layer 150 is deposited over the base plate 110 where the input line 120 and the output line 130 are formed. The ground 140 lies above the first dielectric layer 150. The first dielectric layer 150 has a first via hole VH1 formed by removing part of it. The first conductive portion 160 is formed in the first via hole VH1. The first conductive portion 160 is interposed between the input line 120 and the ground 140 to electrically connect the input line 120 to the ground 140.

Figure 11:
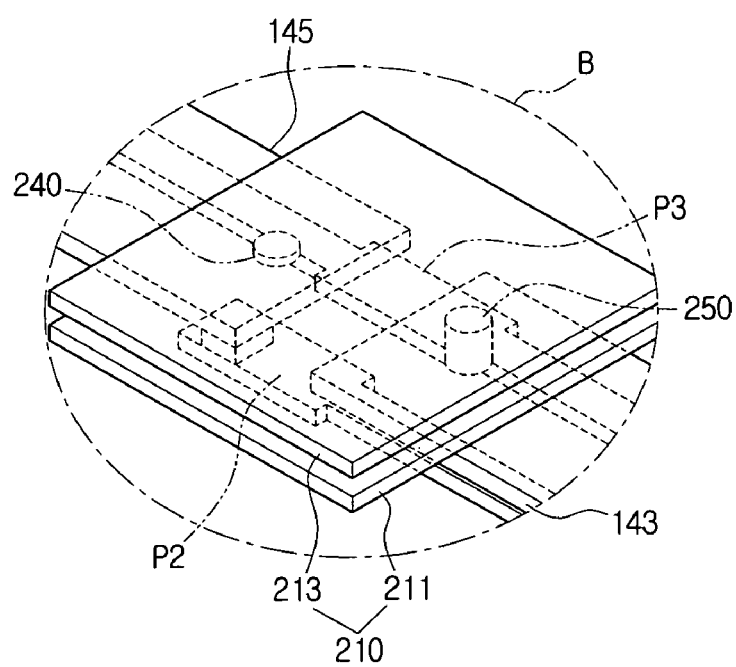
FIG. 11 is an enlarged perspective view of area B of FIG. 9.

FIG. 11 is an enlarged perspective view of area B of FIG. 9.

Referring to FIGS. 10 and 11, the capacitor 210 is positioned above the ground 140. The capacitor 210 at the center of the base plate is electrically connected to the ground 140.

The capacitor 210 includes a first electrode 211 above the second and third metals 143 and 145 and a second electrode 213 over the first electrode 211.

The second dielectric layer 220 intervenes between the ground 140 and the first electrode 211, and the third electric layer 230 intervenes between the first electrode 211 and the second electrode 213. Note that the first, second, and third dielectric layer 150, 220, and 230 may be deposited all over the surface of the base plate 110 and formed of an insulating material, such as aluminum nitride (AlN) or silicon oxide (SiO$_2$).

The second dielectric layer 220 has a second via hole VH2 by removing part of it so as to expose part of the third metal 145. The second conductive portion 240 is formed in the second via hole VH2. The second conductive portion 240 electrically connects the third metal 145 to the first electrode 211.

The first electrode 211, the second dielectric layer 220, and the third dielectric layer 230 have a third via hole VH3 formed by removing part of them so as to expose part of the second metal 143. The third conductive portion 250 is formed through the third via hole VH3. The third conductive portion 250 electrically connects the second metal 143 to the second electrode 213. Note that the width of the third via hole VH3 of the first electrode 211 is wider than the width of the third conductive portion 250. Hence, the first electrode 211 is not in contact with the third conductive portion 250. As a result, the first electrode 211 and the third conductive portion 250 are insulated from each other.

The capacitance of the capacitor 210 is determined by the size of the first and second electrodes 211 and 213. The capacitor 210 in turn determines the capacitance of the balun 200. Specifically, the greater the size of the first and second electrodes 211 and 213, the greater the capacitance of the capacitor 210. Accordingly, the capacitance of the balun 200 also increases.

Since the resonant frequency of the balun 200 decreases with the increasing capacitance, the size of the balun 200 can be reduced.

As the center frequency is adjustable corresponding to the capacitance of the balun 200, the center frequency or the size of the balun 200 can be adjusted by adjusting the size of the capacitor 210.

Figure 12:
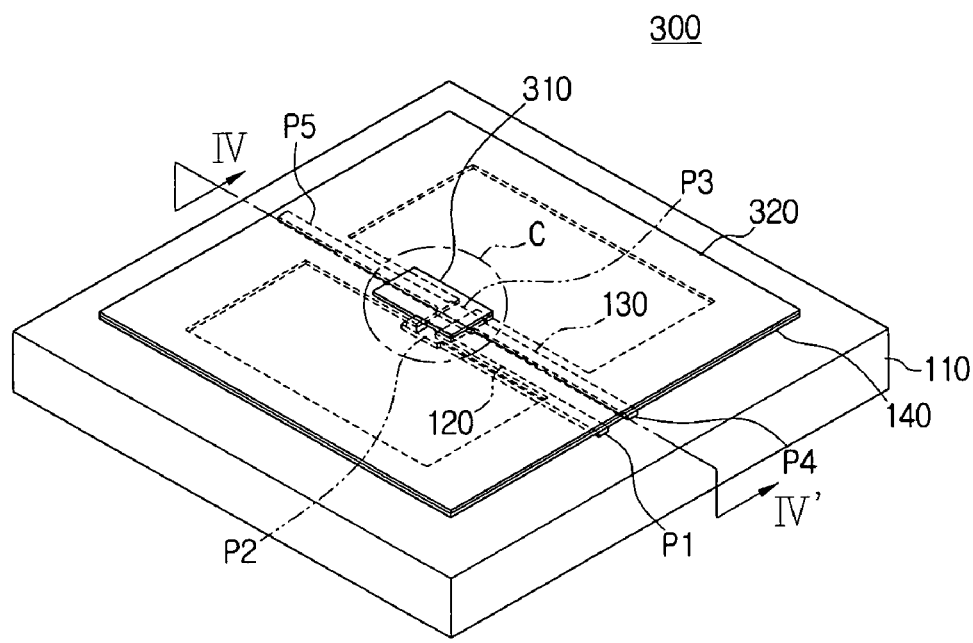
FIG. 12 is a perspective view of a balun in accordance with a third embodiment of the present invention.
Figure 13:
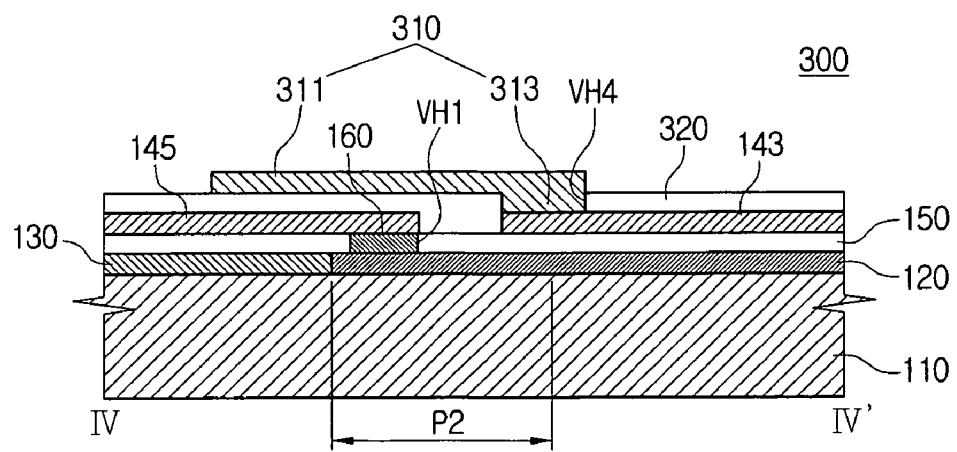
FIG. 13 is a cross sectional view of the balun, taken along the line IV-IV' of FIG. 12.

In FIG. 12, a perspective view of a balun 300 in accordance with a third embodiment of the present invention is shown. FIG. 13 is a cross sectional view of the balun 300, taken along the line IV-IV' of FIG. 12.

The balun 300 has the same structure as the balun 100 of FIG. 3, except that the balun 300 further includes a capacitor 310 and a fourth dielectric layer 320. Thus, the components functioning the same as in the balun 100 of FIG. 3 use the like reference numerals in their description, and further explanations of the like components will be omitted for brevity.

The balun 300 includes a base plate 110, an input line 120, an output line 130, a ground 140, first through fourth dielectric layers 150 and 320, a first conductive portion 160, and a capacitor 310.

The input line 120 and the output line 130 lie on the base plate 110. The input line 120 receives an incoming signal from outside and forwards it to the output line 130. The output line 130 outputs first and second output-signals corresponding to the incoming signal.

The first dielectric layer 150 is deposited over the base plate 110 where the input line 120 and the output line 130 are formed. The ground 140 is formed above the first dielectric layer 150. The first dielectric layer 150 has a first via hole VH1 formed by removing part of it. The first conductive portion 160 is formed in the first via hole VH1. The conductive portion 160 is interposed between the input line 120 and the ground 140 to electrically connect the input line 120 to the ground 140.

Figure 14:
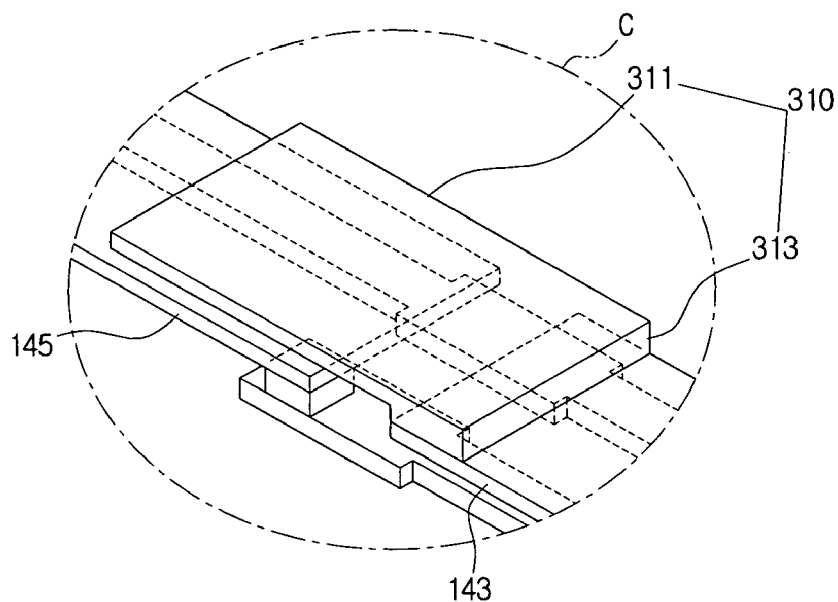
FIG. 14 is an enlarged perspective view of area C of FIG. 12.

FIG. 14 is an enlarged perspective view of area C of FIG. 12. With reference to FIGS. 13 and 14, the capacitor 310 is placed above the ground 140. The capacitor 310 includes a third electrode 311 over the third metal 145 of the ground 140 and a fourth electrode 313, which electrically connects the third electrode 311 to the second metal 143. The fourth electrode 313 extends from the third electrode 311 and is linked to the second metal 143.

The fourth dielectric layer 320 intervenes between the ground 140 and the third electrode 311. The fourth dielectric layer 320 has a fourth via hole VH4 formed by removing part of it so as to expose an end of the second metal 143. The fourth electrode 313 is electrically connected to the second metal 143 through the fourth via hole VH4. Accordingly, capacitance is generated between the third metal 145 and the third electrode 311. The capacitance of the capacitor 310 is determined by the size of the third electrode 311. That is, the greater the size of the third electrode 311, the greater the capacitance of the capacitor 310. Accordingly, the capacitance of the balun 300 also increases according to the size of the third electrode 311. Since the resonant frequency of the balun 300 decreases with the increasing capacitance, the size of the balun 300 can be reduced.

As above, the balun 300 can adjust the center frequency corresponding to the capacitance. Therefore, the center frequency or the size of the balun 300 is adjustable by adjusting the size of the capacitor 310.

Figure 15:
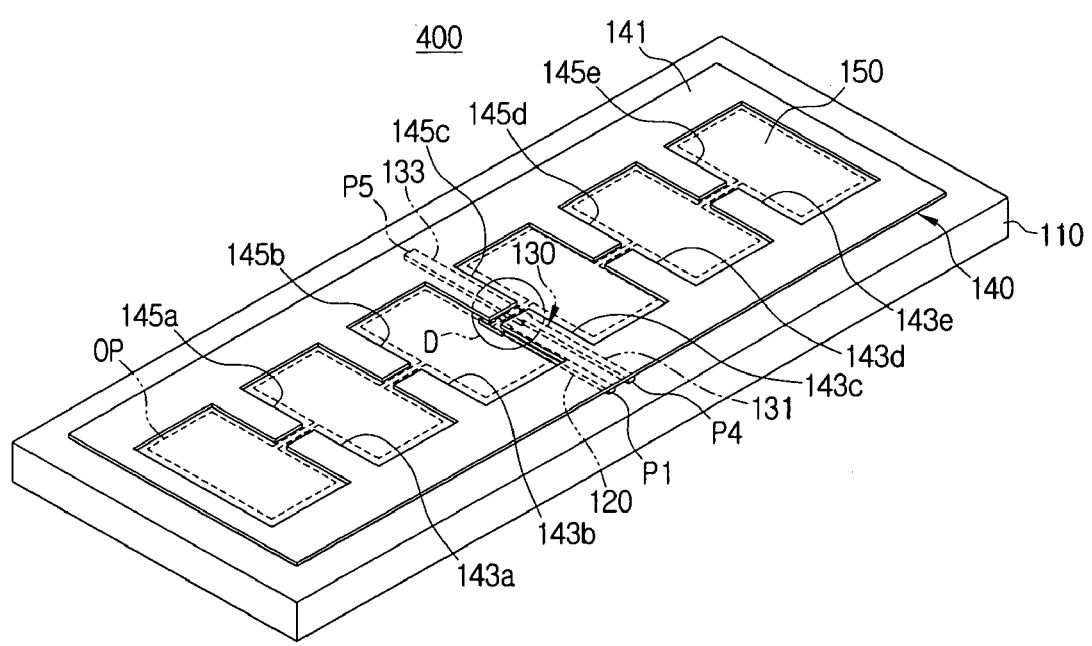
FIG. 15 is a perspective view of a balun in accordance with a fourth embodiment of the present invention.
Figure 16:
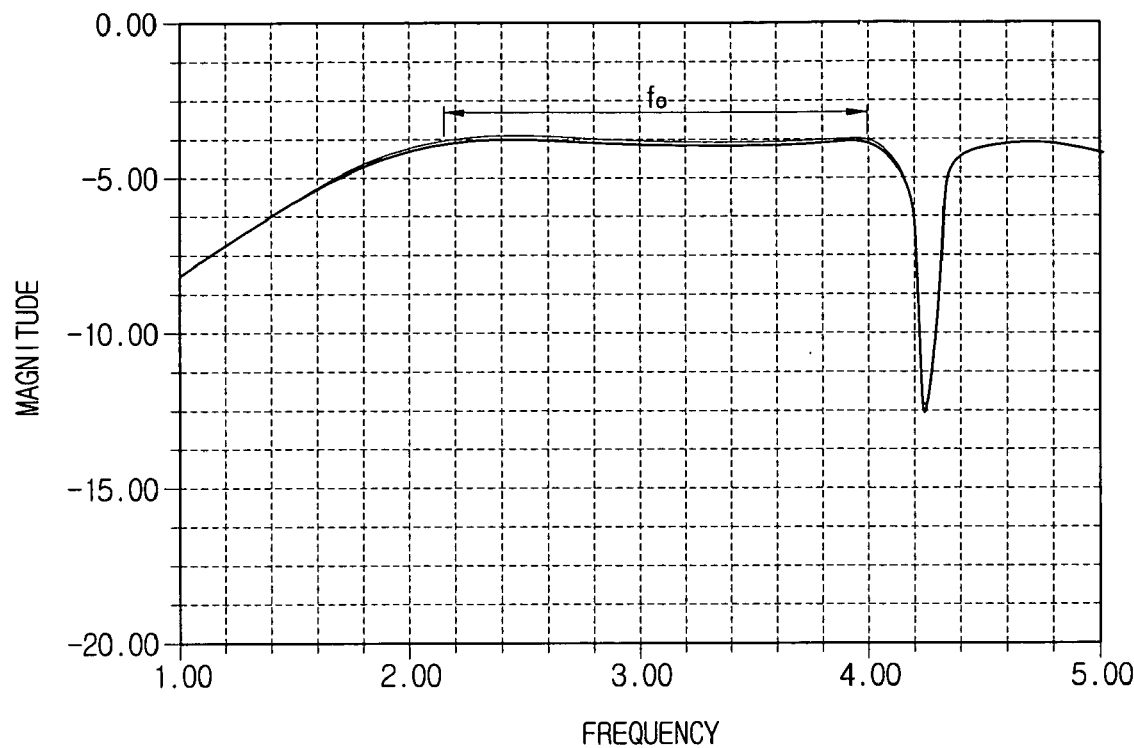
FIG. 16 is a graph showing a magnitude of output signals from output ports of FIG. 15.

In FIG. 15, a perspective view of a balun 400 in accordance with a fourth embodiment of the present invention is shown. FIG. 16 is a graph showing a magnitude of output signals from output ports of the balun 400 shown in FIG. 15.

Referring now to FIG. 15, the balun 400 has the same structure as the balun 100 of FIG. 3, except that the balun 400 has a differently shaped ground 140. Thus, the components having the same function as in the balun 100 of FIG. 3 use the same reference numerals throughout the explanation of the balun 400, and further illustration as to the like components will be omitted for brevity.

The balun 400 includes a base plate 110, an input line 120, an output line 130, a ground 140, and a first dielectric layer 150.

The input line 120 and the output line 130 are placed on the base plate 110. The input line 120 receives an incoming signal from outside and forwards it to the output line 130. The output line 130 outputs first and second output signals corresponding to the incoming signal.

The first dielectric layer 150 is deposited over the base plate 110 where the input line 120 and the output line 130 are placed. The ground 140 lies above the first dielectric layer 150. The first dielectric layer 150 has a first via hole VH1 formed by removing part of it. The first conductive portion 160 is formed in the first via hole VH1. The first conductive portion 160 is interposed between the input line 120 and the ground 140 to electrically connect the input line 120 to the ground 140.

The ground 140 has a first pattern portion electrically connected to the input line 120, and an opening formed by removing part of the ground 140. The first pattern portion of the ground 140 includes a first metal 141 around the perimeter of the base plate 110, a second metal with one or more branches 143a-e extending from the first metal 141, and a third metal with one or more branches 145a-e extending from the first metal 141.

The first metal 141 is formed in a closed-loop shape.

The branches 143a-e of the second metal extend from the first metal 141 to the center of the base plate 110.

The branches 145a-e of the third metal extend from the first metal 141 to the center of the base plate 110, respectively facing the branches 143a-e of the second metal.

More specifically, the branches 145a-e of the third metal face the branches 143a-e of the second metal, away from them at an interval. For example, the first branch 145a of the third metal is spaced apart from the first branch 143a of the second metal at an interval while facing the first branch 143a.

Certain branches of the second and third metals (e.g., branch 143c of the second metal and branch 45c of the third metal) are placed above the input line 120, the first output line 131, and the second output line 133. Hence, the potential difference occurs between the branches 143a-e of the second metal and the branches 145a-e of the third metal. As a result, the phase difference occurs between the first output port P4 and the second output port P5, and the incoming signal is halved and output to the first and second output lines 131 and 133, respectively.

The area D in FIG. 15 is constructed substantially the same as the area A of FIG. 3. Referring to FIG. 6, which is the enlarged view of the area A of FIG. 3, and FIG. 15, parts of the second port P2 and the input port P3 are exposed through the interval between the second and third metals 143 and 145. The end of the third metal 145 is electrically connected to the second port P2 through the first conductive portion 160. Thus, the ground 140 is electrically connected to the input line 120. Herein, even when the ground 140 is electrically connected to the input line 120, all the incoming signal is not induced to the ground 140 because the second metal 143 is spaced apart from the third metal 145. The distance between the second metal 143 and the third metal 145 determines the capacitance of the balun 400.

The opening OP is defined by the first, second and third metals 141, 143, and 145. The size of the opening OP determines the inductance of the balun 100.

In the fourth embodiment of the present invention, the opening OP is repeatedly formed in an 'I' shape. In another embodiment, the opening OP may be formed in various shapes, such as dumbbell or spiral depending on the shape of the metals 141, 143, and 145.

Also, in the fourth embodiment, as the ground 140 is formed by repeatedly arranging the shape of the ground 140 of FIG. 3, the size of the opening OP of the ground 140 is increased. The increased size of the opening OP increases the inductance of the balun 400.

Specifically, the capacitance of the balun 400 may increase according to the distance between the branches 143a-e and 145a-e of the second and third metals. Accordingly, the resonant frequency is decreased and allowing for the size of the balun 400 to be reduced. In addition, the balun 400 can obtain the wide bandwidth in which the usable frequency band $f_0$ covers 1.9 GHz as shown in FIG. 16 by increasing the inductance of the balun 400 with the increased size of the opening OP of the ground 140. Consequently, the size of the balun 140 can be reduced and the wideband matching can be achieved at the same time.

Figure 17:
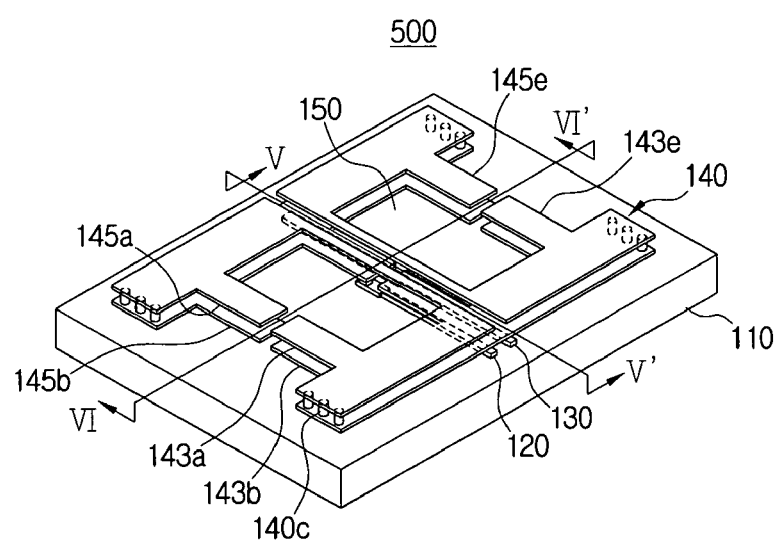
FIG. 17 is a perspective view of a balun in accordance with a fifth embodiment of the present invention.
Figure 18:
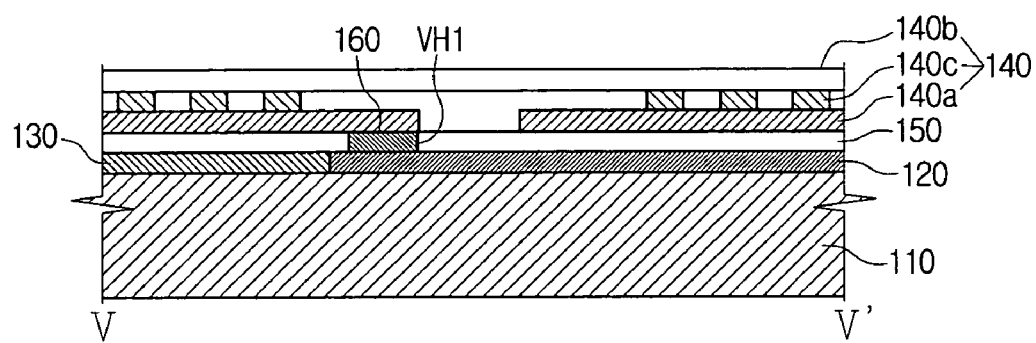
FIG. 18 is a cross sectional view of the balun, taken along the line V-V' of FIG. 17.

In FIG. 17, a perspective view of a balun 500 in accordance with a fifth embodiment of the present invention is shown. FIG. 18 is a cross sectional view of the balun 500, taken along the line V-V' of FIG. 17, and FIG. 19 is a cross sectional view of the balun 500, taken along the line VI-VI' of FIG. 17.

Figure 19:
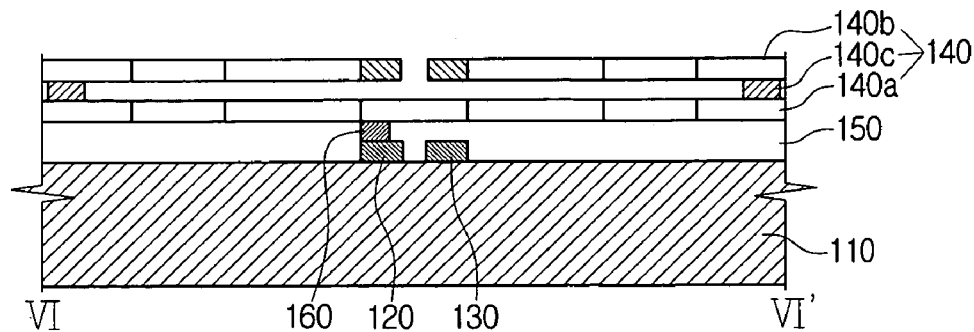
FIG. 19 is a cross sectional view of the balun, taken along the line VI-VI' of FIG. 17.

Referring to FIGS. 17, 18, and 19, the balun 500 has the same structure as the balun 100 of FIG. 3, except that the balun 400 has a differently shaped ground 140. Thus, the components having the same function as in the balun 100 of FIG. 3 use the same reference numerals throughout the explanation of the balun 500, and further illustration as to the like components will be omitted for brevity.

The balun 500 includes a base plate 110, an input line 120, an output line 130, a ground 140, and a first dielectric layer 150.

The input line 120 and the output line 130 are placed on the base plate 110. The input line 120 receives an incoming signal from outside and forwards it to the output line 130. The output line 130 outputs first and second output signals corresponding to the incoming signal.

The first dielectric layer 150 is deposited over the base plate 110 where the input line 120 and the output line 130 are formed. The ground 140 is formed above the first dielectric layer 150. The first dielectric layer 150 has a first via hole VH1 formed by removing part of it. A first conductive portion 160 is formed in the first via hole VH1. The first conductive portion 160 is interposed between the input line 120 and the ground 140 to electrically connect the input line 120 to the ground 140.

The ground 140 includes a first ground 140a, a second ground 140b, and a fourth conductive portion 140c. The first ground 140a is electrically connected to the input line 120 through the first conductive portion 160. The second ground 140b is spaced above and apart from the first ground 140a at an interval. The fourth conductive portion 140c electrically connects the first and second grounds 140a and 140b and supports the second ground 140b to be away from the first ground 140a.

The first and second grounds 140a and 140b have substantially the same shape as the ground 140 of FIG. 15. In detail, the first and second grounds 140a and 140b have the first pattern portion consisting of the first, second, and third metals 141, 143, and 145, and the opening OP defined by the first pattern portion. The second and third metals 143 and 145 include the branches 143a-e and 145a-e extending from the first metal 141 to the center of the base plate 110.

As shown in FIG. 17, the second, third, and fourth branches 143b, 143c, and 143d of the second metal 143 and the second, third, and fourth branches 145b, 145c, and 145d of the third metal 145 can be formed in the first ground 140a. The first and fifth branches 143a and 143e of the second metal 143 and the first and fifth branches 145a and 145e of the third metal can be formed in the second ground 140b.

With the ground 140 constructed above, the opening OP of the ground 140 has substantially the same size as the opening of the ground 140 of FIG. 15. Hence, as the size of the opening OP of the ground 140 is increased by the repetitive shape of the ground 140 of the balun 100 of FIG. 3, the inductance of the balun 500 increases.

In the fifth embodiment of the present invention, the capacitance of the balun 500 can be increased by the distance between the branches 143a-e and 145a-e of the second and third metals 143 and 145. Accordingly, since the resonant frequency decreases, the size of the balun 500 can be reduced. Additionally, the balun 500 can obtain the wide bandwidth in which the usable frequency band covers 1.9 GHz as shown in FIG. 16 by increasing the inductance through the increased size of the opening OP of the ground 140.

In the fifth embodiment, since the ground 140 has the opening substantially in the same size as the ground 140 of the balun 400 of FIG. 15 and has the same inductance, the ground 140 is able to substantially match frequency range shown in FIG. 16. Yet, because the ground 140 has the layered structure of the first ground 140a and the second ground 140b, the size of the balun 500 does not have to increase as a result of the increased size of the ground 140, that is, the increased size of the opening OP.

In one embodiment, the size of the balun having the same usable frequency band can be further reduced by varying the inductance of the balun in the same size.

In light of the foregoing, a balun in accordance with the fifth embodiment may have the input line and the output line formed in the same layer, and the ground having the shape of the opening is formed above the input line and the output line. The first pattern portion of the ground may include the second metal above the first output line and the third metal above the second output line. The third metal can be electrically connected to the input line and spaced apart from the second metal at the interval. Accordingly, the potential difference occurs between the second and third metals. As a result, even when the length of the first and second output lines is smaller than about λ/4 of the incoming wavelength, since the phase difference of the first and second output signals can be about 180 degrees, the size of the balun can be reduced.

Such a balun is able to adjust the capacitance using the capacitor placed on the ground. Since the increased size of the capacitor reduces the center frequency of the balun, the size of the balun can be reduced. Furthermore, the balun can expand the matched frequency range by adjusting the size of the opening of the ground and increasing the inductance. With the layered structure of the ground, it is possible to prevent the size increase of the balun due to the size increase of the opening of the ground.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A balun comprising:
   a plate;
   a first signal line formed on the plate and configured to transfer an incoming signal;
   a second signal line disposed on the plate in a same layer as the first signal line and configured to receive the incoming signal from the first signal line and output first and second output signals that are different from each other;
   a ground disposed on the plate in a different layer from the first and second signal lines, wherein the ground comprises an opening and is configured to generate potential difference between a path in which the first output signal of the second signal line is transferred and a path in which the second output signal of the second signal line is transferred, and wherein the ground is electrically connected to the first signal line; and
   a first dielectric interposed between the first and second signal lines and the ground.

2. The balun as recited in claim 1, wherein the first signal line comprises:
   a first port configured to receive the incoming signal from outside; and
   a second port facing the first port and configured to output the incoming signal received through the first port to the second signal line.

3. The balun as recited in claim 2, further comprising:
   a first conductive portion which electrically connects the first port to the ground,
   wherein the dielectric has a first via hole formed by removing part of the dielectric in an overlapping area of the second port and the ground, and the first conductive portion is electrically connected to the first port and the ground through the first via hole.

4. The balun as recited in claim 3, wherein the ground comprises:
   a first metal disposed a closed-loop shape around a perimeter of the plate;
   a second metal which extends from the first metal and facing the first and second signal lines; and
   a third metal which extends from the first metal, wherein the third metal lies apart from the second metal at an interval in an area corresponding to the first port and the input port and faces the first signal line.

5. The balun as recited in claim 4, wherein the second metal is electrically connected to the second port through the first conductive portion.

6. The balun as recited in claim 4, wherein the second metal and the third metal comprise a plurality of branches extending from the first metal.

7. The balun as recited in claim 3, wherein the ground comprises:
   a first ground electrically connected to the second port through the first conductive portion;
   a second ground disposed above and apart from the first ground; and
   a conductor which electrically connects the first ground with the second ground and supporting the second ground.

8. The balun as recited in claim 2, wherein a width of an area where the first port is formed in the first signal line is wider than a width of other areas.

9. The balun as recited in claim 1, wherein the second signal line comprises:
   an input port disposed adjacent to the second port and configured to receive the incoming signal;
   a first output line extending from the input port, wherein the first output line lies adjacent to the first signal line and is configured to output the first output signal; and
   a second output line which extends from the input port in a different direction from the first output line and configured to output the second output signal.

10. The balun as recited in claim 9, wherein the input port is disposed at a center of the second signal line.

11. The balun as recited in claim 9, wherein a length of the first signal line is about equal to a length covering the input port and the first output line.

12. The balun as recited in claim 1, wherein a phase difference between the first output signal and the second output signal is about 180 degrees.

13. The balun as recited in claim 1, further comprising:
   at least one capacitor disposed over the ground and electrically connected to the ground.

14. The balun as recited in claim 13, wherein the capacitor comprises:
  a first electrode disposed over the ground, wherein the first electrode is electrically connected to the ground on the side of the second signal line where the second output signal is output; and
  a second electrode disposed over the first electrode, wherein the second electrode is electrically connected to the ground on the side of the first signal line where the first output signal is output.

15. The balun as recited in claim 14, further comprising:
a second dielectric between the ground and the first electrode; and
a third dielectric between the first electrode and the second electrode.

16. The balun as recited in claim 15, wherein the second dielectric has a second via hole formed by removing part of the second dielectric to expose part of the ground the second area,
  wherein the third dielectric has a third via hole formed by removing part of the third dielectric to expose part of the ground on the side of the first signal line where the first output signal is output,
  wherein the first electrode is electrically connected to the ground through the second via hole, and
  wherein the second electrode is electrically connected to the ground through the third via hole.

17. The balun as recited in claim 16, further comprising:
  a second conductive portion disposed in the second via hole and configured to electrically connect the first electrode to the ground; and
  a third conductive portion disposed in the third via hole and configured to electrically connect the second electrode to the ground.

18. The balun as recited in claim 17, wherein an area of the first electrode corresponding to the third conductive portion is removed and the first electrode is insulated from the third conductive portion.

19. The balun as recited in claim 13, wherein the capacitor comprises:
  a third electrode disposed over substantially all of the first and second areas above the ground; and
  a fourth electrode which extends from the third electrode perpendicular to the third electrode, wherein the fourth electrode lies on the side of the first signal line where the first output signal is output and contacts with the ground to electrically connect the ground to the third electrode.

20. The balun as recited in claim 19, wherein the fourth electrode is integrally formed with the third electrode.

21. The balun as recited in claim 20, further comprising:
a fourth dielectric disposed between the third electrode and the ground.

22. A balun comprising:
a plate;
a first signal line comprising a first port formed at a first end and configured to receive an incoming signal and a second port formed at a second end facing the first end and configured to output the incoming signal received from the first port, wherein the first signal line is formed on the plate and configured to transfer the incoming signal;
a second signal line disposed on the plate adjacent to the first signal line, wherein the second signal line traverses a center of the plate, has an input port formed adjacent to the second port and configured to receive the incoming signal from the second port, and is configured to output at ends first and second output signals having different phases from each other corresponding to the incoming signal respectively;
a ground disposed around a perimeter of the plate and comprising a first metal in a closed-loop shape, a second metal extending from the first metal to the center of the plate and facing the first and second signal lines, and a third metal extending from the first metal to the center of the plate, facing the second signal line, and disposed apart from the second metal at an interval in an area where the input port and the second port are disposed, wherein the ground is electrically connected to the second port; and
a dielectric disposed between the first and second signal lines and the ground.

23. A balun comprising:
a plate;
a first signal line comprising a first port formed at a first end and configured to receive an incoming signal and a second port formed at a second end facing the first end and configured to output the incoming signal received from the first port, wherein the first signal line is formed on the plate and configured to transfer the incoming signal;
a second signal line disposed on the plate adjacent to the first signal line, wherein the second signal line traverses a center of the plate, has an input port formed adjacent to the second port and configured to receive the incoming signal from the second port, and is configured to output at ends first and second output signals having different phases from each other corresponding to the incoming signal respectively;
a ground disposed around a perimeter of the plate and comprising a first metal in a closed-loop shape, a second metal which extends from the first metal to the center of the plate and facing the first and second signal lines, and a third metal extending from the first metal to the center of the plate, facing the second signal line, and disposed apart from the second metal at an interval in an area where the input port and the second port are disposed, wherein the ground is electrically connected to the second port;
a dielectric disposed between the first and second signal lines and the ground; and
a capacitor disposed over the ground and comprising a first electrode electrically connected to the third metal and a second electrode disposed over and apart from the first electrode and electrically connected to the second metal.

24. A balun comprising:
a plate;
a first signal line comprising a first port formed at a first end and configured to receive an incoming signal and a second port formed at a second end facing the first end and configured to output the incoming signal received from the first port, wherein the first signal line is formed on the plate and configured to transfer the incoming signal;
a second signal line disposed on the plate adjacent to the first signal line, wherein the second signal line traverses center of the plate, has an input port formed adjacent to the second port and configured to receive the incoming signal from the second port, and is configured to output at ends first and second output signals having different phases from each other corresponding to the incoming signal respectively;

a ground disposed around a perimeter of the plate and comprising a first metal in a closed-loop shape, a second metal extending from the first metal to the center of the plate and facing the first and second signal lines, and a third metal extending from the first metal to the center of the plate, facing the second signal line, and disposed apart from the second metal at an interval in an area where the input port and the second port are placed, wherein the ground is electrically connected to the second port;

a dielectric disposed between the first and second signal lines and the ground; and a capacitor disposed over the ground and comprising a third electrode spaced apart from the third metal at an interval and a fourth electrode extending from the third electrode and contacting with the second metal.

* * * * *